United States Patent
Lee et al.

(10) Patent No.: US 6,974,650 B2
(45) Date of Patent: Dec. 13, 2005

(54) METHOD OF CORRECTING A MASK LAYOUT

(75) Inventors: Kay Ming Lee, Pai (SG); Cheng-Wen Fan, Hsin-Chu (TW); Jiunn-Ren Hwang, Hsin-Chu (TW); Chih-Chiang Liu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 297 days.

(21) Appl. No.: 10/063,779

(22) Filed: May 12, 2002

(65) Prior Publication Data

US 2003/0211398 A1 Nov. 13, 2003

(51) Int. Cl.⁷ ............................................... G03F 9/00
(52) U.S. Cl. ............................................. 430/5; 430/30
(58) Field of Search .................. 430/30, 5, 22; 382/144

(56) References Cited

U.S. PATENT DOCUMENTS

| | | | | |
|---|---|---|---|---|
| 5,879,844 A | * | 3/1999 | Yamamoto et al. | 430/30 |
| 5,916,716 A | * | 6/1999 | Butsch et al. | 430/30 |
| 6,120,953 A | * | 9/2000 | Lin | 430/30 |
| 6,475,684 B2 | * | 11/2002 | Ki | 430/30 |
| 6,586,146 B2 | * | 7/2003 | Chang et al. | 430/30 |

* cited by examiner

Primary Examiner—Saleha R. Mohamedulla
(74) Attorney, Agent, or Firm—Winston Hsu

(57) ABSTRACT

A method of correcting a mask layout is provided. The mask layout includes a plurality of element patterns. An inspection program is executed to classify the element patterns of the mask layout into a plurality of element pattern types according to a pattern density of the element patterns. Following this, each of the element pattern types is corrected so as to prevent a plasma micro-loading effect.

17 Claims, 6 Drawing Sheets

METHOD OF CORRECTING A MASK LAYOUT

BACKGROUND OF INVENTION

1. Field of the Invention

The present invention relates to a method of correcting a mask layout, and more particularly, to a method of correcting systematic errors produced during a pattern transfer process on a mask layout.

2. Description of the Prior Art

To form a designed integrated circuit (IC) on a semiconductor wafer, a semiconductor foundry forms a mask with a designed layout pattern and then performs a photolithographic process to transfer the designed layout pattern on the mask to a photoresist layer positioned on a semiconductor wafer. Following this, an etching process is performed using the photoresist layer as an etching mask, transferring patterns of the photoresist layer to the semiconductor wafer. The photolithographic process and the etching process are the most important steps for determining the IC patterns during the semiconductor manufacturing process.

However, during the photolithographic process, a pattern transferring deviation occurs due to an overexposure or an underexposure at corners of the closely arranged mask patterns. As Being non-uniformly exposed, an optical proximity effect occurs, to affecting the pattern transferring precision on the photoresist layer. To prevent the optical proximity effect from affecting the pattern transferring precision, a solution is using to use a computer aided design (CAD) system to provide an optical proximity correction (OPC) on the mask patterns.

Furthermore, a pattern transferring deviation also occurs in the etching process since it is believed that different pattern densities of the IC elements induce a micro-loading effect. Therefore, a method for improving an etching uniformity on a semiconductor wafer is required.

Please refer to FIG. 1, which shows a mask layout according to the prior art. The mask layout includes a plurality of linear element patterns A, B, and C for defining conductive areas, such as word lines or bit lines. The element patterns A, B, and C have an equal line width w. A line space s between two element patterns A is defined as a, a line space s between two element patterns B is defined as b, and a line space s between two element patterns C is defined as c. The line spaces a, b, and c are not equal, and the pattern densities of the element patterns A, B, and C on the mask layout are therefore considered different.

Next, please refer to FIG. 2, which shows a relationship between an etched line width w and a line space s between the element patterns on the mask layout. The vertical axis of the relation diagram represents an after-etch-inspection (AEI) critical dimension of an element pattern's line width, The horizontal axis of the relation diagram represents a line space between two element patterns of the mask layout. The circles represent experimental values of the etched line width, and the solid line represents a fitting curve of the experimental values of the etched line width. As shown in FIG. 2, since a value of the etched line width w changes as a result of a micro-loading effect or other systematic errors, different etched line widths w are achieved for the element patterns having different pattern densities. For example, when the etched line width increases with an increase in the line space between two adjacent element patterns, a greater etched line width is achieved for the isolated element patterns, and a narrower etched line width is achieved for the dense element patterns.

For an integrated circuit with design rules of 0.18 $\mu$m, micro-loading effect is mildly regarded slight since it is not a subject factor to affect etching uniformity of a semiconductor wafer. However, when the design rules of the semiconductor elements lower to 0.15 $\mu$m, 0.13 $\mu$m, or even 0.1 $\mu$m, a 10 nm line width deviation creates an error percentage of 6%, 8%, or even 10%. Therefore, improvement in surface uniformity has become an important issue for the manufacturing process, especially for the design rules of below 0.15 $\mu$m.

SUMMARY OF INVENTION

It is an objective of the claimed invention to provide a method of correcting a mask layout to effectively prevent micro-loading effect from inducing pattern transferring deviations.

According to the claimed invention, a mask layout including a plurality of element patterns is provided. An inspection program is executed to classify the element patterns of the mask layout into a plurality of element pattern types according to a pattern density of the element patterns. Following this, each of the element pattern types is corrected so as to prevent a plasma micro-loading effect.

It is an advantage of the present invention that pattern densities that result in the micro-loading effect, are used to classify the element patterns of the mask layout, and a suitable correction is made on each type of the element patterns. Following this, a surface uniformity of a semiconductor wafer is improved, and production yields for the semiconductor products are also increased, especially for the manufacturing process of design rules below 0.15 $\mu$m.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
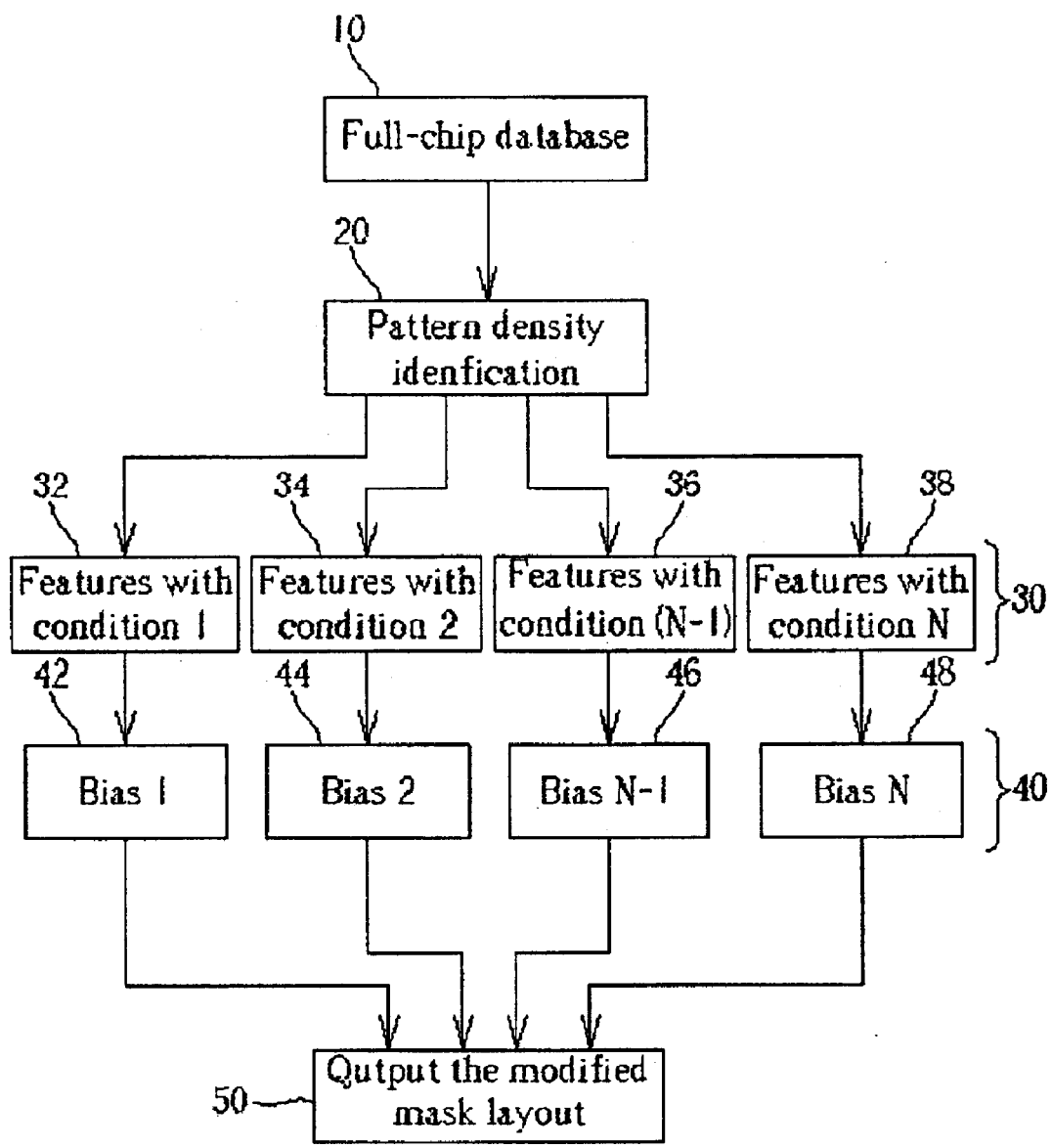
FIG. 3 is a flowchart of a method for correcting a mask layout according to the present invention.

Please refer to FIG. 3 of a flowchart of a method for correcting a mask layout to prevent a micro-loading effect according to the present invention. As shown in FIG. 3, the first step 10 of the present invention includes providing a mask layout database. The mask layout database stores parameters for designing a plurality of (linear) element patterns on a mask layout. The element patterns are applicable to define different elements on a single-chip. For example, the element patterns define a bit line or a word line in a memory cell region, in a logic circuit region, or in both the memory cell region and the logic circuit region, depending on an electrical circuit design. In addition, the element patterns are applicable to a multi-chip arrangement for defining the same elements on different chips.

As the micro-loading effect is resultsed from different pattern densities of the element patterns, a step 20 of the present invention provides an inspection program to classify the element patterns into a plurality types according to their pattern densities. For example, as shown in step 30, the element patterns are divided into four types of element patterns 32, 34, 36, and 38 after classifyingclassification. The element patterns 32, 34, 36, and 38 have different pattern densities and are called dense patterns, sub-dense patterns, semi-dense patterns, and isolated patterns, respectively.

Following this, as shown in step 40, a line width correction is made on each of the element pattern types. For example, a line width correction of a first constant value 42 is made on the element patterns 32, a line width correction of a second constant value 44 is made on the element patterns 34, a line width correction of a N−1 constant value 46 is made on the element patterns 36, and a line width correction of a N constant value 48 is made on the element patterns 38. Finally, as shown in step 50, a corrected mask layout including the corrected element patterns is outputted and the correcting method of the present invention is complete.

Figure 1:
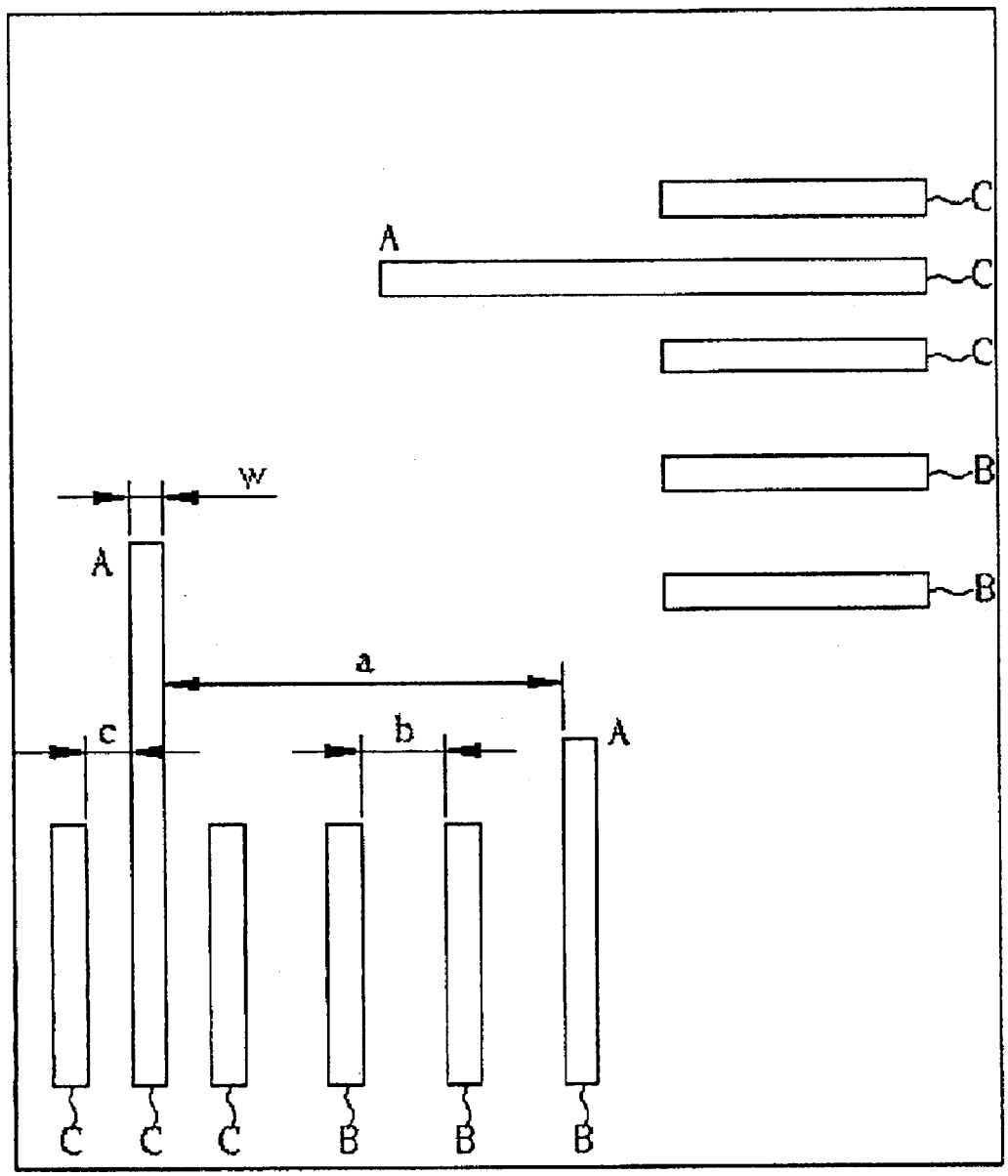
FIG. 1 is a schematic diagram of a mask layout according to the prior art.
Figure 4:
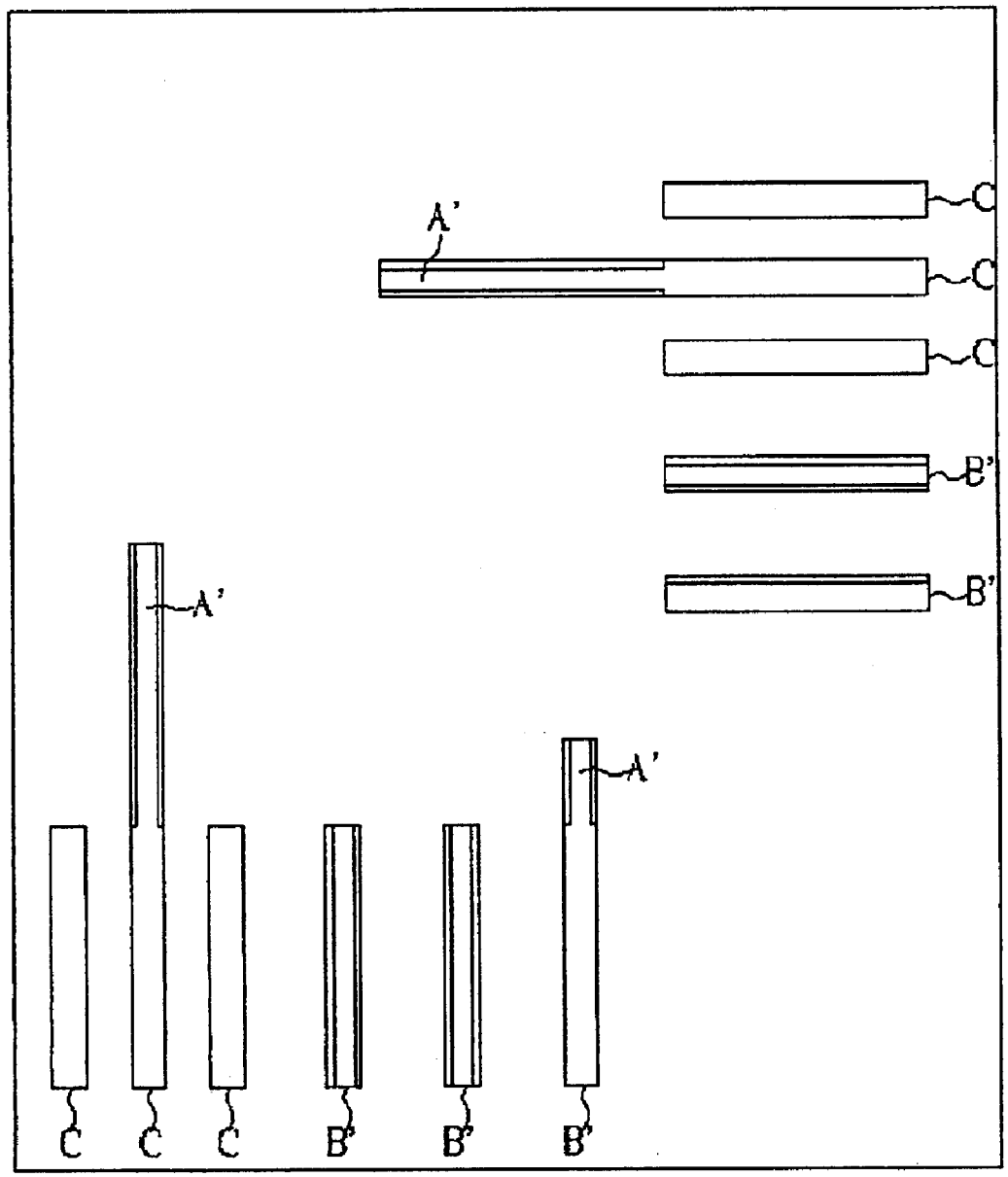
FIG. 4 is a schematic diagram of a corrected mask layout according to the present invention.

As shown in FIG. 4, the corrected mask layout is illustrated. A line width correction is made on the element patterns A, B, and C on the mask layout shown in FIG. 1. The original element patterns A, B, and C have equal widths. However, after correction, a line width of the isolated element patterns is decreased, such as the corrected element patterns A" and B". The line width correction includes increasing the line widths of the element patterns or decreasing the line widths of the element patterns, depending on the pattern density of the element pattern to be corrected.

Figure 5:
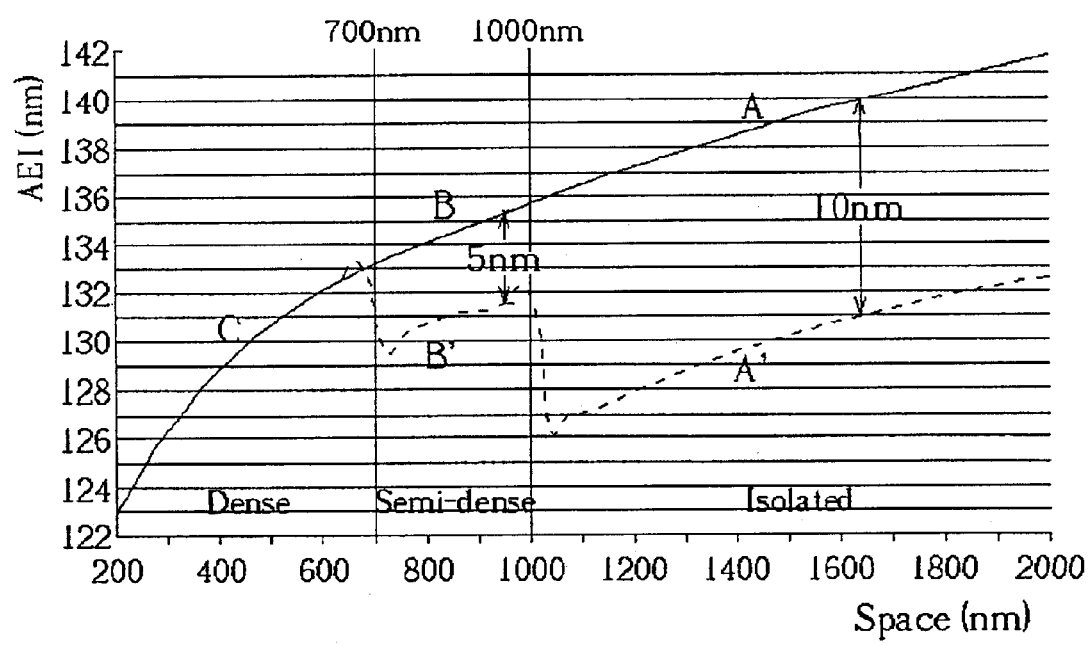
FIG. 5 is a comparative diagram between an etched line width undergoing a micro-loading correction according to the present invention and an etched line width without micro-loading correction according to the prior art method.
Figure 6:
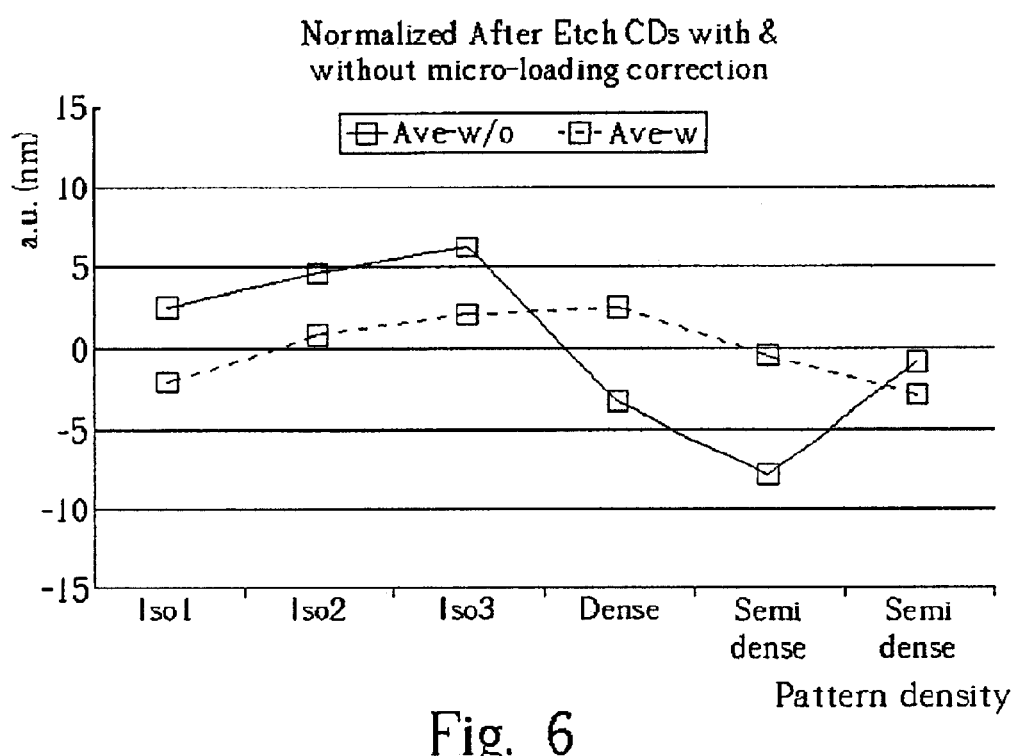
FIG. 6 is a comparative diagram of an etched line width deviation between the present invention and the prior art method.

As shown in FIG. 5 and FIG. 6, after the element patterns are transferred to a semiconductor wafer, an etched line width of the corrected element patterns A" and B" is in a reasonable range (between 126 nm and 132 nm). In comparison with an etched line width of the element pattern C (between 123 nm and 133 nm), the etched line width difference between the element patterns A and C or between the element patterns B and C is effectively settled. In addition, an etched line width deviation of the element patterns is lowered to below 5 or 6 nm according to the present invention. In comparison with the etched line width deviation of the prior art method of being approximately 15 nm, the corrected mask layout of the present invention effectively improves etching uniformity on a semiconductor wafer.

An important feature of the present invention is to classify element patterns on a mask layout depending on a pattern density of each of the element patterns. After classifying the element patterns into different types, a line width correction of a constant value is made on each element pattern that belongs to the same element pattern type.

In the preferred embodiment, the pattern density is determined by a distance between two adjacent line patterns. For example, for the element patterns A, B, and C, a pattern density order of these three element patterns is determined by the values of the line spaces a, b, and c. In addition, the pattern density can be determined by other ways which that can distinguish dense patterns from isolated patterns, such as dividing a line width of an element pattern by a line space between this element pattern and an adjacent element pattern. For example, the pattern density d between two element patterns A is calculated with the following equation: d=w/a; wherein w represents a line width of the element pattern A, and a represents a line space between two adjacent element patterns A.

Figure 2:
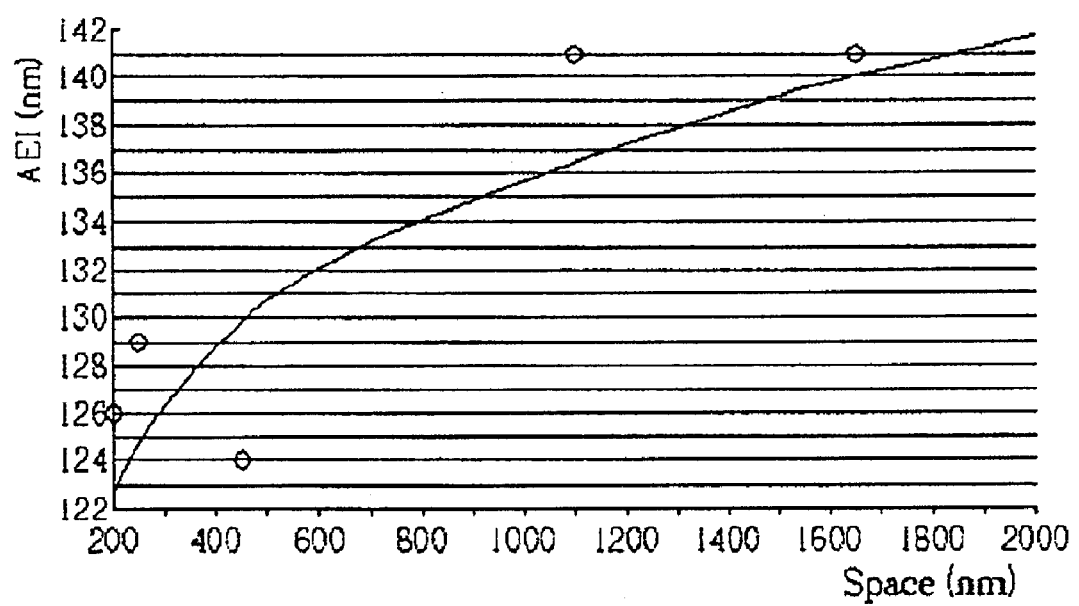
FIG. 2 is a schematic diagram for chart illustrating a relationship between an etched line width and a line space of a mask layout according to the prior art.

In addition to the pattern density, the present invention may use a deviation data of the transferred (etched) element patterns to classify the element patterns of the mask layout. Specifically, the present invention uses the schematic diagram illustrating the relationship between the etched line width and the line space (FIG. 2) to set a plurality of line space ranges. According to these line space ranges, the element patterns are divided into dense patterns, semi-dense patterns and isolated patterns. Following this, a line width correction of a constant value is made on each element pattern that belongs to the same type.

In contrast to the prior art, the method of the present invention uses pattern densities, which result in the microloading effect, to classify the element patterns of a mask layout and determine a suitable correction value for each type of the element patterns. As a result, a surface uniformity of a semiconductor wafer is improved, and production yields for the semiconductor products are also increased, especially for the manufacturing process of design rules below 0.15 $\mu$m.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of correcting a mask layout, the mask layout comprising a plurality of line patterns, the method comprising:

providing line width deviation data of transferred line patterns, the line width deviation comprising a deviation of an after-etch-inspection critical dimension of the transferred line patterns onto a wafer;

executing an inspection program to classify the line patterns of the mask layout into at least a first-type line pattern and a second-type line pattern according to the line width deviation data of the transferred line patterns; and making a line width correction of a first constant value on the first-type line pattern and making a line width correction of a second constant value on the second-type line pattern.

2. The method of claim 1 wherein a pattern density of the first-type line pattern is different from a pattern density of the second-type line pattern.

3. The method of claim 2 wherein the pattern density is determined by a distance between two adjacent line patterns.

4. The method of claim 1 wherein the line width deviation is a result of a systematic error.

5. The method of claim 1 wherein the line width deviation is a result of a micro-loading effect.

6. The method of claim 1 wherein the first-type line pattern comprises dense patterns or semi-dense patterns, and the second-type line pattern comprises isolated patterns.

7. The method of claim 1 wherein the first-type line pattern comprises isolated patterns or semi-isolated patterns, and the second-type line pattern comprises dense patterns.

8. The method of claim 1 wherein the line width correction of the first constant value and the line width correction of the second constant value comprise increasing line widths of the line patterns or decreasing the line widths of the line patterns.

9. The method of claim 1 wherein each of the line patterns is used for defining a conductive area.

10. A method of correcting a mask layout, the mask layout comprising a plurality of element patterns, the method comprising:
   providing pattern deviation data of transferred element patterns, the pattern deviation comprising a deviation of an after-etch-inspection critical dimension of the transferred element patterns onto a wafer;
   executing an inspection program to classify the element patterns of the mask layout into at least a first-type element pattern and a second-type element pattern according to the pattern deviation data of the transferred element patterns; and
   making a selective correction on the first-type element pattern and the second-type element pattern, respectively.

11. The method of claim 10 wherein the element patterns comprise line patterns.

12. The method of claim 11 wherein the selective correction comprises increasing line widths of the line patterns or decreasing the line widths of the line patterns.

13. The method of claim 10 wherein the pattern deviation is a result of a systematic error.

14. The method of claim 10 wherein the pattern deviation is a result of a micro-loading effect.

15. The method of claim 10 wherein the first-type element pattern comprises dense patterns or semi-dense pattern, and the second-type element pattern comprises isolated patterns.

16. The method of claim 10 wherein the first-type element pattern comprises isolated pattern, or semi-isolated patterns, and the second-type element pattern comprises dense patterns.

17. The method of claim 10 wherein each at the element patterns is used to define a conductive area.

* * * * *

UNITED STATES PATENT AND TRADEMARK OFFICE
CERTIFICATE OF CORRECTION

PATENT NO. : 6,974,650 B2 Page 1 of 1
APPLICATION NO. : 10/063779
DATED : December 13, 2005
INVENTOR(S) : Lee et al.

It is certified that error appears in the above-identified patent and that said Letters Patent is hereby corrected as shown below:

On the Title Page, Item (75), Inventors: "Kay Ming Lee, Pai (SG);"

should read --Kay Ming Lee, Hsin-Chu (TW);--.

Signed and Sealed this

Nineteenth Day of September, 2006

JON W. DUDAS
*Director of the United States Patent and Trademark Office*